(12) United States Patent
Breitwisch et al.

(10) Patent No.: US 8,107,276 B2
(45) Date of Patent: Jan. 31, 2012

(54) RESISTIVE MEMORY DEVICES HAVING A NOT-AND (NAND) STRUCTURE

(75) Inventors: Matthew J. Breitwisch, Essex Junction, VT (US); Gary S. Ditlow, Yorktown Heights, NY (US); Michele M. Franceschini, Yorktown Heights, NY (US); Luis A. Lastras-Montano, Yorktown Heights, NY (US); Robert K. Montoye, Yorktown Heights, NY (US); Bipin Rajendran, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/631,310

(22) Filed: Dec. 4, 2009

(65) Prior Publication Data

US 2011/0134676 A1 Jun. 9, 2011

(51) Int. Cl.
*G11C 11/00* (2006.01)
(52) U.S. Cl. .................. 365/148; 365/163; 365/49.1
(58) Field of Classification Search .................. 365/148, 365/163, 49.1
See application file for complete search history.

(56) References Cited

U.S. PATENT DOCUMENTS

| 7,274,586 B2 | 9/2007 | Choi et al. |
| 7,742,331 B2 * | 6/2010 | Watanabe .................. 365/148 |
| 2004/0095802 A1 | 5/2004 | Tran |
| 2004/0174732 A1 * | 9/2004 | Morimoto .................. 365/148 |
| 2005/0195633 A1 | 9/2005 | Choi et al. |
| 2006/0007729 A1 | 1/2006 | Cho et al. |
| 2008/0029799 A1 | 2/2008 | Ahrens et al. |
| 2008/0074927 A1 | 3/2008 | Hofmann et al. |
| 2008/0106926 A1 * | 5/2008 | Brubaker et al. .......... 365/148 |
| 2008/0112218 A1 | 5/2008 | Katagiri |
| 2009/0027956 A1 | 1/2009 | Choi et al. |
| 2009/0067229 A1 | 3/2009 | Kang et al. |

FOREIGN PATENT DOCUMENTS

EP 1455363 B1 6/2007

OTHER PUBLICATIONS

Avelino Ong; "On Calling Station Codes"; IEEE Transactions on Information Theory, Nov. 1969; pp. 736-737.
C.V. Freiman; "Optimal Error Detection Codes for Completely Asymmetric Binary Channels"; Information and Control 5, 1962, pp. 64-71.
Donald T. Tang et al.; "Distance-2 Cyclic Chaining of Constant-Weight Codes"; IEEE Transactions on Computers, vol. c-22, No. 2, Feb. 1973, pp. 176-180.
Hung-Yu Li et al.; "An And-Type Match-Line Scheme for High Performance Energy-Efficient Content Addressable Memories"; IEEE Journal of Solid-State Circuits, vol. 41, No. 5, May 2006, pp. 1108-1119.

(Continued)

*Primary Examiner* — Huan Hoang
(74) *Attorney, Agent, or Firm* — Cantor Colburn LLP; Brian Verminski (57) ABSTRACT

Resistive memories having a not-and (NAND) structure including a resistive memory cell. The resistive memory cell includes a resistive memory element for storing a resistance value and a memory element access device for controlling access to the resistive memory element. The memory element access device is connected in parallel to the resistive memory element.

16 Claims, 11 Drawing Sheets

OTHER PUBLICATIONS

Low-Power NAND PCM Structure with Enhanced Matching Capabilities; IBM Research, 2008 IBM Corporation, pp. 1-18.
Low-Power NAND PCM Structure; IBM Research, 2008 IBM Corporation, pp. 1-11.
J.M. Berger; "A Note on Error Detection Codes for Asymmetric Channels", Information and Control 4, 1961, pp. 68-73.
Jinn-Shyan Wang et al.; "An AND-Type Match-Line Scheme for Energy-Efficient Content Addressable Memories", ISSCC 2005 / Session 25 / Dynamic Memory / 25.4, pp. 464-465 and continuation page.
Kostas Pagiamtzis et al.; "Content-Addressable Memory (CAM) Circuits and Architectures: A Tutorial and Survey",; IEEE Journal of Solid-State Circuits, vol. 41, No. 3, Mar. 2006, pp. 712-727.
Kostas Pagiamtzis et al.; "A Soft-Error Tolerant Content-Addressable Memory (CAM) Using an Error-Correcting-Match Scheme"; Department of Electrical and Computer Engineering University of Toronto, Toronto, Ontario, Canada, pp. 1-4.
R.C. Heimiller; "A Code Separation Property"; IRE Transactions on Information Theory; IEEE Xplore, Downloaded Oct. 20, 2008, pp. 382-388.
Roberto Bez et al.; "Introduction to Flash Memory"; Proceedings of the IEEE, vol. 91, No. 4, Apr. 2003; pp. 489-502.
Tarek A. Ibrahim et al., "All-Optical AND/NAND Logic Gates using Semiconductor Microresonators", IEEE Photonics Technology Letters, vol. 15, No. 10, Oct. 2003, pp. 1422-1424.
Thomas M. Cover.; "Enumerative Source Encoding" IEEE Transactions on Information Theory, vol. IT-19, No. 1, Jan. 1973; pp. 73-33.
PCT/EP2010/065794—Written Opinion dated Feb. 22, 2011.
PCT/EP2010/065794—International Search Report—Date: Feb. 22, 2011.
F. J. MacWilliams and N. J. A. Sloane (1979). "The Theory of Error-Correcting Codes"; Amsterdam: North-Holland, Chapter 17 "Bounds on the Size of a Code"; pp. 524-527.

* cited by examiner

RESISTIVE MEMORY DEVICES HAVING A NOT-AND (NAND) STRUCTURE

BACKGROUND

The present invention relates to memory devices, and more specifically, to phase change memory (PCM) devices, and their use in standard memory and content addressable memory (CAM) applications.

PCM is a form of resistive non-volatile computer random-access memory (RAM) that stores data by altering the state of the matter from which the device is fabricated. The structure of the material can change rapidly back and forth between amorphous and crystalline on a microscopic scale. In the amorphous or disordered phase, the material has a high electrical resistance; in the crystalline or ordered phase, its resistance is reduced. This allows electrical currents to be switched on and off, representing digital high and low states.

CAM is a special type of computer memory used in certain very high speed searching applications. It is also known as associative memory or associative storage. Most existing CAM products are volatile technologies based on SRAM or DRAM cells. CAMS using resistance-change memory elements such as, for example, Chalcogenide phase change materials, have been found to allow for density improvements in the formation of a CAM.

Unlike standard computer memory (e.g., RAM) in which the user supplies a memory address and the RAM returns the data word stored at that address, a CAM is designed such that the user supplies a data word and the CAM searches its entire memory to see if that data word is stored anywhere in it. If the data word is found, the CAM returns a list of one or more storage addresses where the word was found (and in some architectures, it also returns the data word, or other associated pieces of data). Thus, a CAM is the hardware embodiment of what, in software terms, could be called an associative array. Binary CAM is the simplest type of CAM which uses data search words comprised entirely of 1s and 0s. Ternary CAM (TCAM) allows a third matching state of "X" or "Don't Care" for one or more bits in the stored data-word, thus adding flexibility to the search. For example, a TCAM might have a stored word of "10XX0" which will match any of the four search words "10000", "10010", "10100", or "10110".

SUMMARY

An exemplary embodiment is a memory that includes a first resistive memory cell. The first resistive memory cell includes a resistive memory element for storing a resistance value and a memory element access device for controlling access to the resistive memory element. The memory element access device is connected in parallel to the resistive memory element.

Another exemplary embodiment is memory that includes a group of resistive memory cells. The group of resistive memory cells includes a plurality of resistive memory cells connected to each other in a series having two extremes. Each resistive memory cell in the group includes a resistive memory element for storing a resistance value, and a memory element access device for controlling access to the resistive memory element. The memory element access device is connected in parallel to the resistive memory element. The group of resistive memory cells also includes a group access device for controlling access to the resistive memory cells. The group access device is connected to one of the extremes.

A further exemplary embodiment is a method for writing to memory. The method includes raising a voltage level at a first extreme of a group of resistive memory cells that are connected to each other in a series having two extremes including the first extreme and a second extreme. Each resistive memory cell in the group includes a resistive memory element for storing a resistance value and a memory element access device for controlling access to the resistive memory element. The memory element access device is connected in parallel to the resistive memory element. The group of resistive memory cells is connected to a group access device at one of the extremes. The memory element access devices in the resistive memory cells are turned off. The resistive memory cells in the group are programmed to a reset state. Programming the resistive memory cells in the group to a reset state includes: turning on the group access device for the group; turning on the memory element access devices in the resistive memory cells in the group; turning off the memory element access devices in the group; and turning off the group access device for the group. Selected resistance resistive memory cells in the group are programmed to a set state. Programming the selected resistive memory cells in the group to a set state includes: turning on the group access device for the group, turning on the memory element access devices in the resistive memory cells in the group, turning off the memory element access devices in the selected resistive memory cells in the group, and turning off the group access device for the group.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

An exemplary embodiment of the present invention includes resistive memory devices, such as phase change memory (PCM) devices, having resistive memory cells made up of memory element access devices and resistive memory elements arranged in a not-and (NAND) configuration. In the NAND configuration each resistive memory cell includes a memory element access device that is electrically connected in parallel to a resistive memory element. This is contrasted with the typical not-or (NOR) PCM configuration where each resistive memory cell includes a memory element access device that is electrically connected in serial to a resistive memory element.

Figure 1:
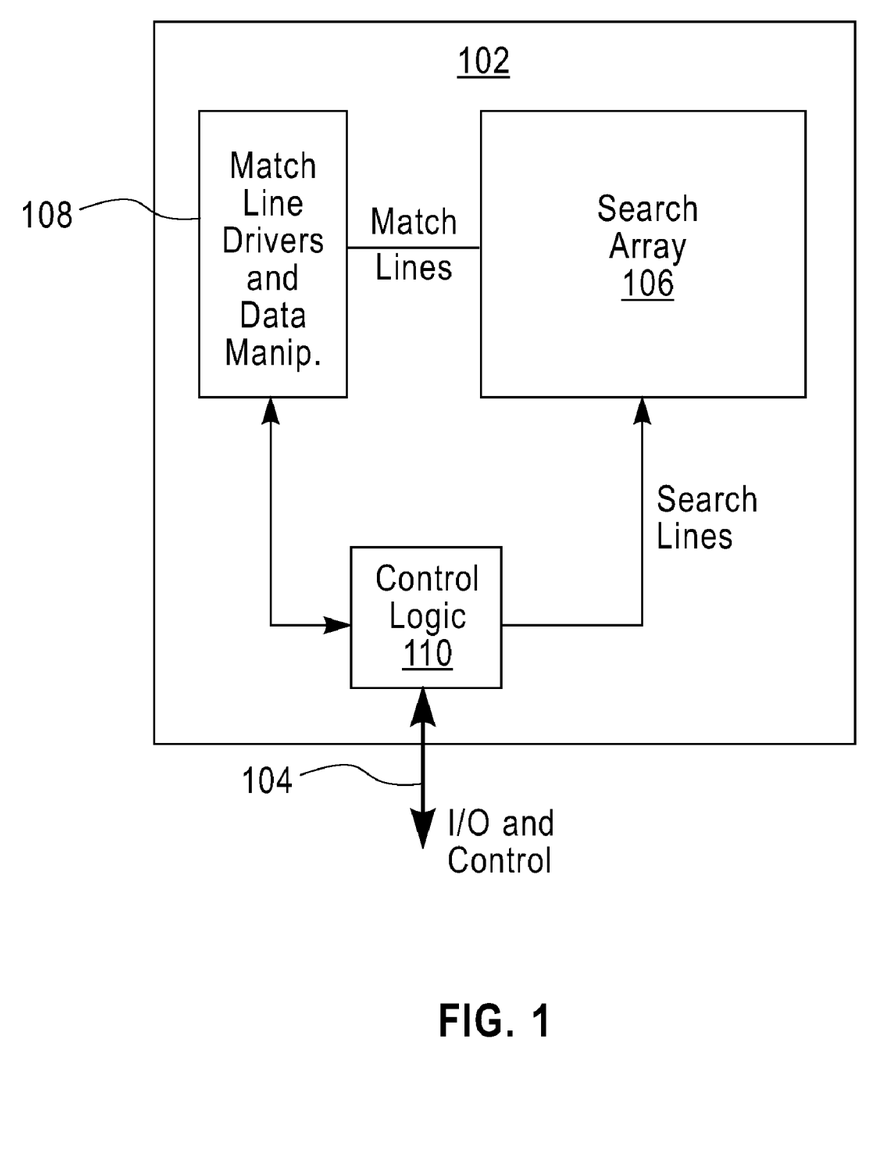
FIG. 1 depicts an exemplary content addressable memory (CAM) device that may be utilized by an exemplary embodiment.

Exemplary embodiments will be employed in a memory device or in a content addressable memory device (CAM). As an example, FIG. 1 depicts an exemplary CAM memory device 102 that may be utilized by an exemplary embodiment. The CAM memory device 102 depicted in FIG. 1 is operated through an input/output and control bus 104 which drives control logic 110. The control logic 110 is responsible for applying specific search patterns to be searched in a memory array 106. The memory array 106 is connected to a circuit 108, which is responsible for driving the match-lines in the memory array 106, and collecting and processing the search results.

Figure 2:
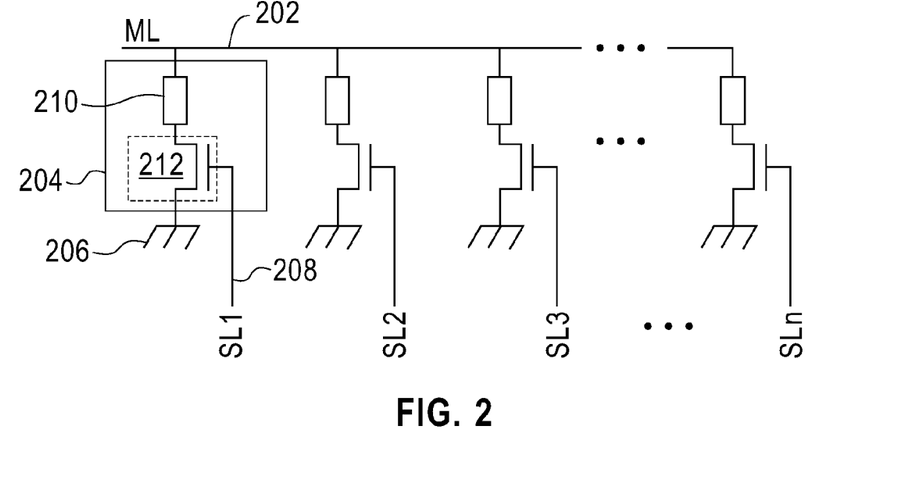
FIG. 2 depicts a typical phase change memory (PCM) configuration.

FIG. 2 depicts a typical PCM configuration that may be utilized for both standard memory operations (e.g., accessed via a memory address) and content addressable memory (CAM) (including ternary CAM or "TCAM") operations. The PCM configuration includes a match line (ML) 202, a plurality of resistive memory cells 204, a search line 208 connected to each resistive memory cell 204, and a ground 206 directly connected to each resistive memory cell 204. Each resistive memory cell 204 depicted in FIG. 2 includes an memory element access device 212 and a resistive memory element 210 that are electrically coupled to each other in a serial fashion.

As depicted in FIG. 2, the resistive memory cells 204 are all directly electrically coupled to the match line 202 in a parallel fashion. The configuration depicted in FIG. 2, where each resistive memory cell 204 has one end connected to the ML 202 and the other end directly connected to the ground 206, is often referred to as a NOR configuration. The NOR configuration allows for the standard matching capabilities of CAM using two resistive memory cells 204 (each with one memory element access device and one resistive memory element) to store a data bit. Typical CAM operation includes receiving a data word made up of data bits (in this example "n/2" data bits when two resistive memory cells 204 store a single data bit) and comparing contents of the resistive memory cells 204 to the data word. This is usually done by expanding the "n/2" bits to "n" signals to be applied to the search lines 208, typically by expanding each bit to two signals representing the bit itself and the negated version of the bit, respectively. In the NOR configuration, the ML 202 is pulled low when a mismatch occurs and is pulled high when a match occurs.

The NOR configuration depicted in FIG. 2 may also be utilized for standard memory operations. During standard memory operations the ML 202 becomes a bit-line (BL) and the SL 208 becomes a word-line (WL). A bit stored into one resistive memory cell connected to a BL is retrieved by turning off all the access devices of the resistive memory cells connected to the BL except for the access device of the resistive memory cell to be read, which is turned on. The BL (i.e., ML 202) is pulled low when the stored bit is "0" and is pulled high when the stored bit is "1". To this end, to store a "0", a resistive memory element is programmed with a low resistance value, whereas, to store a "1", a resistive memory element is programmed with a high resistance value.

Figure 3:
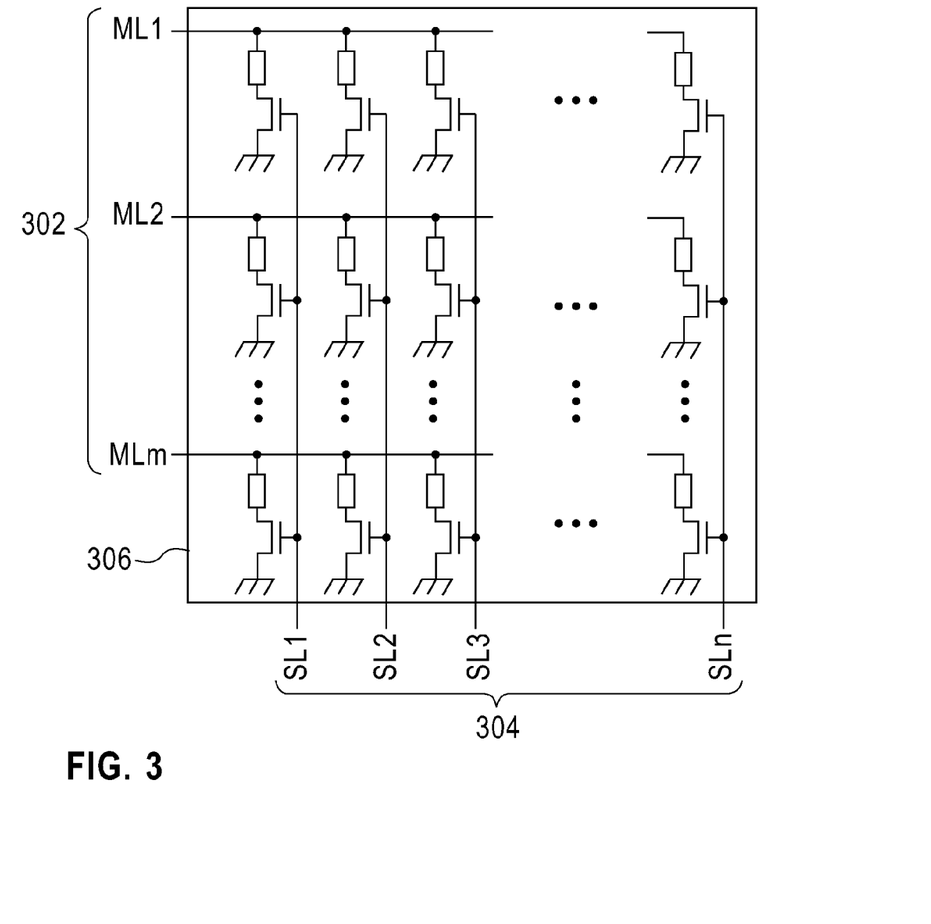
FIG. 3 depicts a typical memory array structure containing memory cells in a not-or (NOR) configuration.

FIG. 3 depicts a possible structure of memory array 106 for performing CAM operations using standard NOR structure PCM memory cells 204. The array 306 depicted in FIG. 3 comprises as input a set 304 of search lines SL1, . . . , SLn. As depicted in FIG. 3, a set 302 of match-lines, ML1, . . . , MLm, is used to read the results of the search operation. A similar structure can be used to perform standard memory operations.

Figure 4:
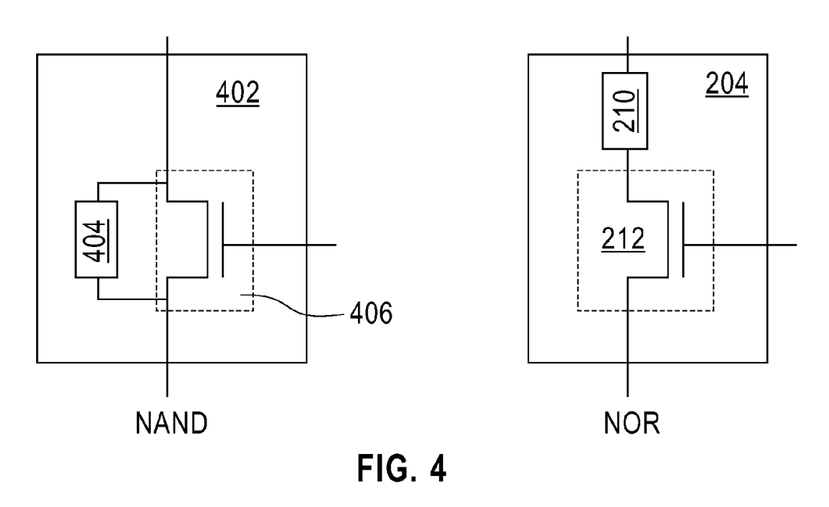
FIG. 4 depicts a memory cell in a not-and (NAND) configuration that may be implemented by an exemplary embodiment.

FIG. 4 depicts a resistive memory cell 402 in a NAND configuration that may be implemented by an exemplary embodiment. FIG. 4 also depicts the resistive memory cell 204 used in the NOR configuration of FIG. 2 for comparison purposes. Any NAND configured resistive memory cell known in the art may be implemented by an exemplary embodiment. In an exemplary embodiment, the NAND resistive memory cell 402 includes a resistive memory element 404 for storing a resistance value. In an exemplary embodiment, the NAND resistive memory cell 402 also includes a memory element access device 406 electrically connected to the resistive memory element 404 in a parallel manner. This is contrasted with the NOR resistive memory cell 204 where the resistive memory element 210 and the memory element access device 212 are electrically connected in a serial manner.

In an exemplary embodiment, the resistive memory elements 404 are formed as PCM elements. Phase change materials can be manipulated into different phases or states, with each phase representing a different data value. Generally, each phase exhibits different electrical properties (or different resistance values). The amorphous and crystalline phases are typically two phases used for binary data storage (1's and 0's) since they have detectable differences in electrical resistance.

In an exemplary embodiment, the memory elements 404 are phase change elements comprised of a phase change material, such as germanium-antimony-tellurium (GST). In an exemplary embodiment, the memory elements 404 are programmed to one of two states: a crystalline state or an amorphous state. In the crystalline state (SET), the memory elements exhibit relatively low resistances and require less current to be programmed. On the other hand, in the amorphous state (RESET), the memory elements 404 have relatively high resistances and require more current to be programmed.

Any resistive memory elements 404 known in the art may be implemented by exemplary embodiments. Possible resistive memory elements 404 that may be implemented include, but are not limited to phase change memories (PCMs) and magnetoresistive RAMs (MRAMs).

The memory element access device 406 may be implemented by a device such as, but not limited to, a field effect transistor (FET), or a bipolar junction transistor (BJT).

In an exemplary embodiment, the memory element access device 406 is implemented by a (FET) including two diffusions, and the resistive memory element 404 is implemented by a PCM element including two sides. In this embodiment, one electrode of the PCM element 404 is connected to one of the FET diffusions, and the other electrode of the PCM element 404 is connected to the other FET diffusion.

Figure 5:
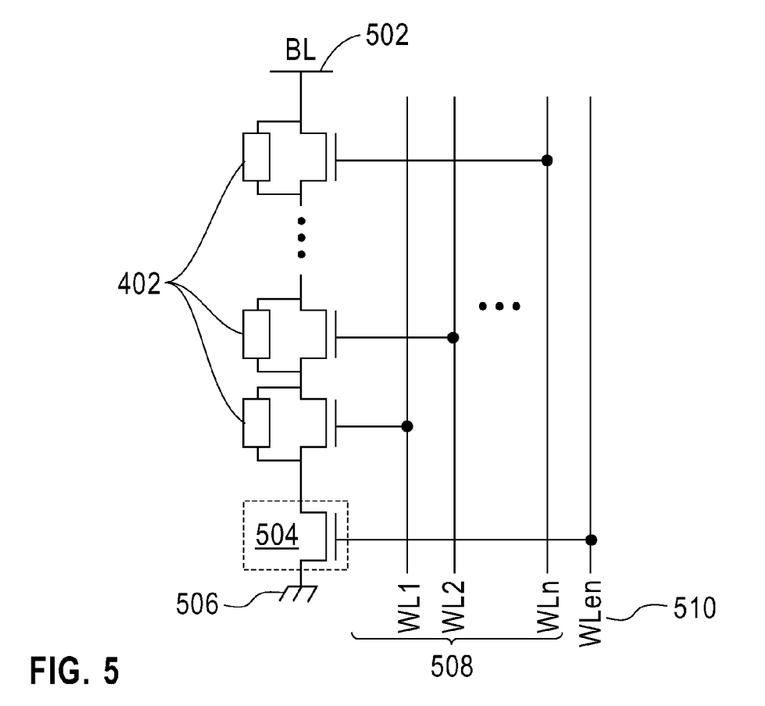
FIG. 5 depicts a layout of a portion of a PCM device having NAND basic memory cells that may be implemented by an exemplary embodiment.

FIG. 5 shows a circuit of a portion of a PCM device having NAND resistive memory cells 402 that may be implemented by an exemplary embodiment. As depicted in FIG. 5, the PCM device includes a group of resistive memory cells 402 that are accessed via a BL 502 and corresponding WLs 508 (to turn the access devices on or off in each resistive memory cell 402). The resistive memory cells 402 in the group depicted in FIG. 5 are serially connected to each other with the BL 502 at one end, and a single ground 506 attached via an additional transistor, referred to herein as a WL enable transistor 504, at the other end of the line. The WL enable transistor 504 is selected so that it is capable of driving the reset and set currents, and the read current. The ends of the group (e.g., where the BL 502 and the ground 506 are attached) are referred to herein as the extremes of the group.

As depicted in FIG. 5, the source of one transistor in the group is connected to the drain of an adjacent transistor in the group. Also depicted in FIG. 5 is a WL enable line 510 that is utilized to turn the entire group on or off by controlling the gate on the WL enable transistor 504 (also referred to herein as a "group access device"). When the WL enable transistor 504 is turned off (gate is open) no current passes through the resistive memory cells 402 in the line. The WL enable transistor 504 is turned on (gate is closed) when one or more of the resistive memory cells 402 in the group are being programmed (e.g., written to) or being read (e.g., standard read, CAM read). In an alternate exemplary embodiment, the WL enable transistor 504 is located at the other end (the other "extreme") of the group between the BL 502 and the first resistive memory cell 402 in the line.

Exemplary embodiments may result in increased system throughput because all of the resistive memory cells 402 in a group may be programmed (e.g., reset) in parallel. In an exemplary embodiment, all of the resistive memory cells 402 in the group are reset in parallel by first turning off all of the transistors located in the resistive memory cells 402 (i.e., the memory element access devices that are parallel to the resistive memory elements). Then, the voltage of the BL 502 is raised to a predetermined reset voltage level (Vr) and the WL enable line 510 is pulsed. Pulsing the WL enable line 510 causes the WL enable transistor 504 to drive the reset current which resets all of the resistive memory cells 402 in the group (i.e., puts them in a high state). In this manner, each of the resistive memory cells 402 in the group is reset in parallel.

In an exemplary embodiment, a selected resistive memory cell 402 in the group is set (i.e., put in a low state) by raising the BL 502 to a predetermined set voltage level (Vs), turning on all of the transistors located in the resistive memory cells 402 except for the transistor in the selected resistive memory cell 402, and pulsing the WL enable line 510. Pulsing the WL enable line 510 causes the WL enable transistor 504 to drive the set current to the selected resistive memory cell 402. All resistive memory elements whose access device is on will be subject to a current lower than the set current since the access device acts as a current bypass. The WL enable line 510 is pulsed for a time sufficient to set the selected resistive memory cell 402. In this manner, the selected resistive memory cell 402 in the group is set. In an exemplary embodiment, the reset voltage level is higher than the set voltage level. In other exemplary embodiments, more than one resistive element is set at the same time, by turning off two or more access devices at the same time during the application of the set current.

Figure 6:
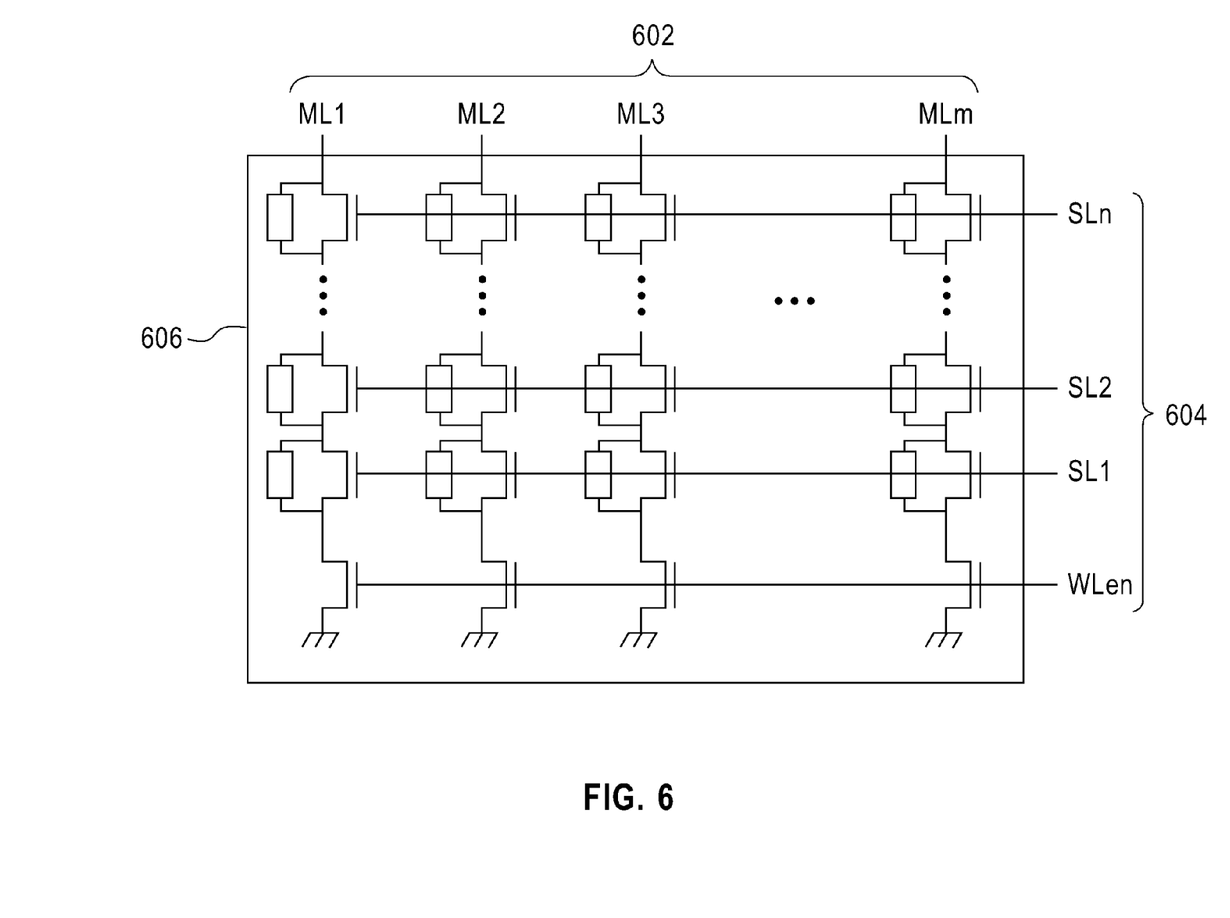
FIG. 6 depicts a memory array structure containing memory cells in a NAND configuration that may be implemented by an exemplary embodiment.

FIG. 6 depicts an example structure of memory array 106 that may be implemented by an exemplary embodiment to perform CAM operations when using NAND configured memory cells 402. The array 606 receives as input a set 604 of search lines SL1, . . . , SLn. A set 602 of match-lines, ML1, . . . , MLm, is used to read the results of the search operation. A similar structure may also be used to perform standard memory operations.

Figure 7:
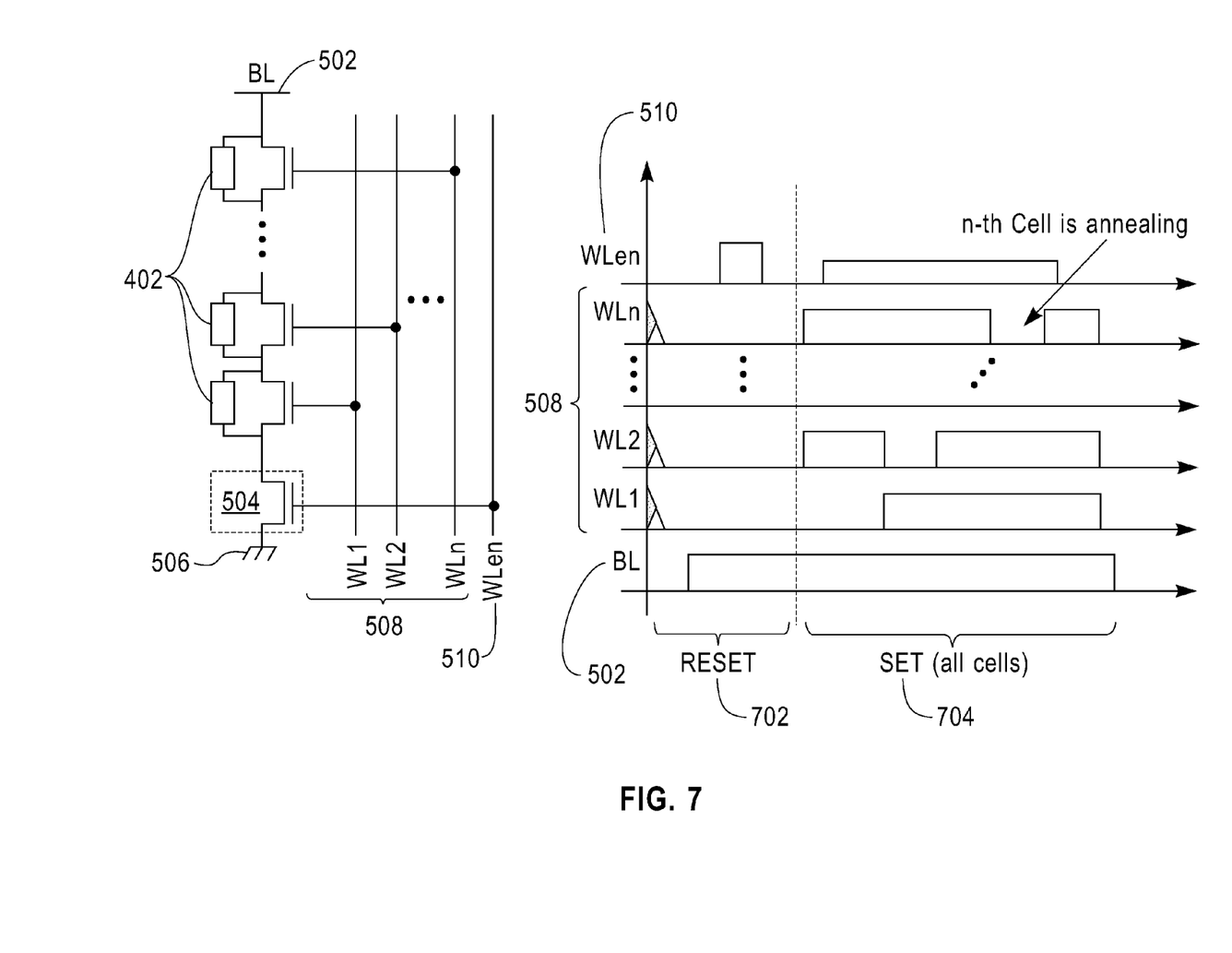
FIG. 7 depicts write symbols that may be implemented by an exemplary embodiment.

FIG. 7 depicts write signals that may be implemented by exemplary embodiments to set and reset a group of serially connected resistive memory cells 402. As shown in FIG. 7, a reset 702 of all of the serially connected resistive memory cells 402 is performed by turning off all access devices of the resistive memory cells by applying low voltage to the WLs 508, applying a voltage level to the BL 502 that is high enough to achieve threshold switching of all the resistive memory elements, and pulsing the WL enable line 510. Once all resistive memory elements achieve threshold switching, a reset current is passing through all of the resistive memory cells 402 in the group. By rapidly switching off the group access device, or WL enable transistor 504 (via the WL enable line 510), all the resistive memory elements are quenched in a reset state which exhibits a high resistance. In exemplary embodiments, the voltage applied to the BL 502 is larger than the number of resistive memory cells 402 in the group times the threshold voltage of the resistive memory elements. In other exemplary embodiments the voltage is lower and the threshold switching of all the resistive memory cells 402 is achieved by exploiting the parasitic capacitance associated with each access device drain diffusion.

FIG. 7 shows exemplary embodiments, where all resistive memory elements 402 are set 704, i.e., programmed in a low resistance state. In exemplary embodiments, a resistive memory element is set by turning off its memory element access device and turning on the memory element access devices associated with all the other resistive memory cells 402 in the group.

To set the first resistive memory element 402 in the group, all WL signals 508 are turned on except for the WL signal associated with the first memory cell, labeled "WL1", which is turned off. The voltage driven by the BL 502 is a voltage suitable for the set operation of the particular memory technology, material composition, and memory element shape. The group enable line, or WL enable line 510, is then pulsed with a voltage suitable to obtain a current appropriate to set a resistive memory element 402. The current flow in the resistive memory element whose access device is turned off causes the transition of the resistive memory element to a low resistance state. A similar operation can then be repeated for all the resistive memory elements that are to be set.

In exemplary embodiments one or more of the resistive memory cells 402 that need to be set are set at the same time, by turning off the corresponding access devices at the same time and turning on all the remaining resistive memory cell access devices and applying signals to the BL 502 and WL enable line 510 as described above. The appropriate set current is specified by the particular technology of the resistive memory element. The voltage applied to the group access device, or WL enable transistor 507, can be obtained as a function of the set current and of the descriptive parameters of the group access device by solving for the voltage in a standard circuit model for the group access device.

Those skilled in the art will recognize that the present invention is not limited to a particular memory element technology but may be applied to any resistive memory technology. In exemplary embodiments, the resistive memory elements are PCM elements. In further exemplary embodiments the access devices are field effect transistors (FET). In additional exemplary embodiments the access devices are bipolar junction transistors (BJT).

Figure 8:
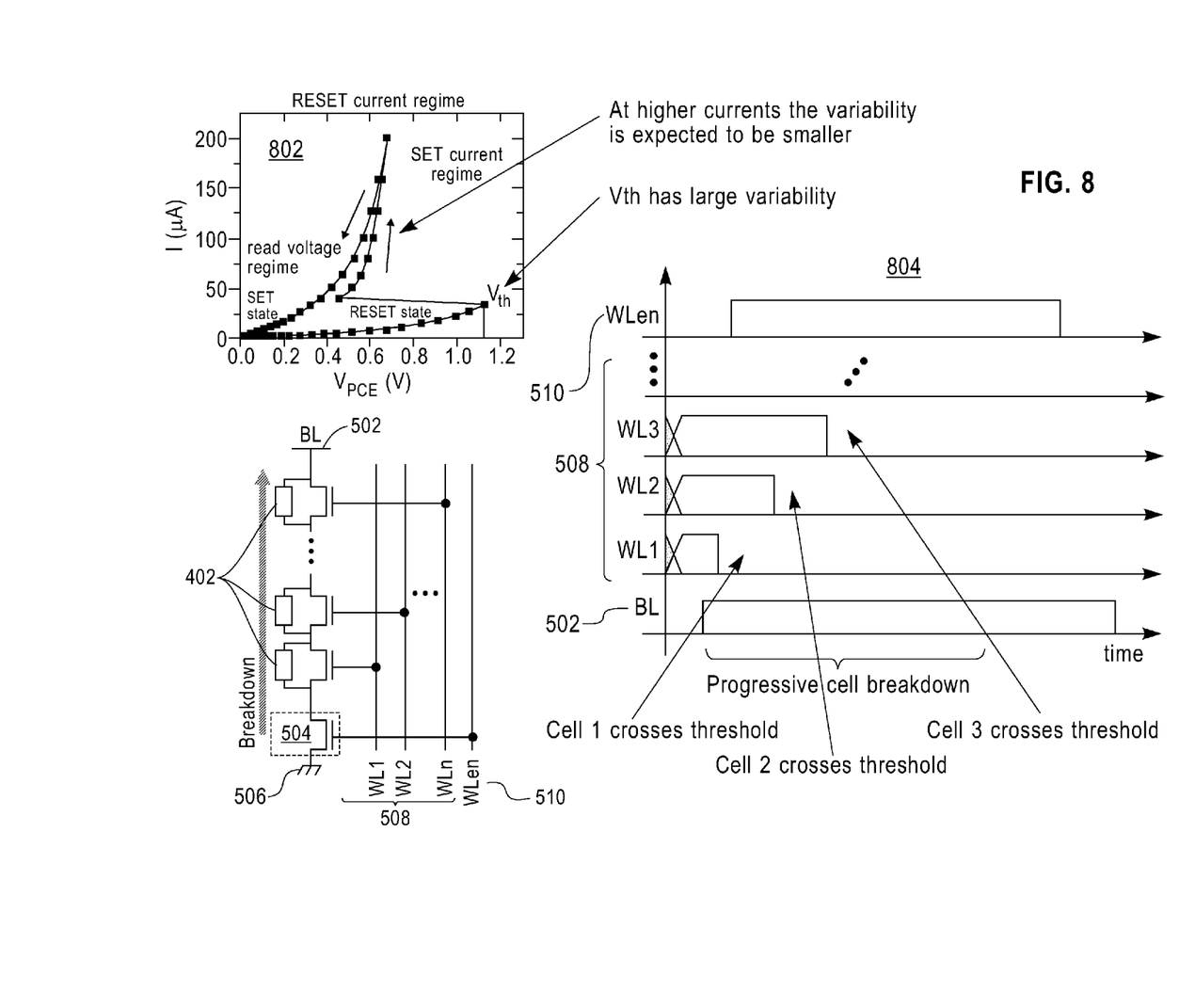
FIG. 8 depicts an exemplary embodiment that may be implemented to reduce the required reset voltage level (Vr)

FIG. 8 depicts an exemplary embodiment that may be implemented to reduce the reset voltage level (Vr) required to perform a reset of a group of serially connected resistive memory cells 402. Graph 802 shows the typical relationship between voltage (V) and current (I) for a PCM element. When the PCM element is in a reset state, to obtain significant current conduction, a threshold switching mechanism must be activated. The threshold switching mechanism, as known in the art, requires the application of a voltage above a threshold voltage which depends on the memory element technology as well as the particular state of the memory element. In addition, as shown in FIG. 8, and known in the art, as current levels become higher less voltage is required to drive the required reset (and set) resistance values into a memory cell. The total voltage required to achieve the current needed to reset the resistive memory cells 402 is therefore, in quasi-static conditions equal to the sum of the threshold voltage associated to each resistive memory cell 402, which is approximately the typical threshold voltage of a resistive memory cell 402 in reset state times the number of resistive memory cells 402 in reset state in the group. This voltage may be large, depending on the technology and on the number of resistive memory cells 402 in a group.

Thus, in order to reduce Vr, an exemplary embodiment increases current flow during reset by first turning on all the access devices of the resistive memory cells 402 and then turning them off in a sequential manner during the reset process. In this way, the threshold switching happens sequentially, which greatly reduces the voltage required to induce reset in all the resistive memory cells 402. In an exemplary embodiment, to perform a reset of the resistive memory cells 402 in the group, all of the transistors, or access devices, located in the resistive memory cells 402 (i.e., those that are parallel to the resistive memory elements) are turned on (i.e., gates are open) by setting the corresponding WLs 508 to a high voltage. Then, the voltage of the BL 502 is raised to the reduced Vr, the access device of the first resistive memory cell is turned off by lowering the voltage signal on the WL 508 (e.g., the WRL 508 labeled "WL1") of the corresponding access device, and the word-line enable signal 510 is pulsed causing the threshold switching of the first resistive memory element.

At a predetermined point in time, the WL 508 labeled "WL2" is set to turn off the access device in the second resistive memory cell 402 to cause threshold switching of the second resistive memory element. The operation of turning off in sequence the signals associated to the access devices WL3, WL4, . . . , WLn, is then repeated until all memory elements in the group achieve a current above the threshold switching current, and sufficient to reset the resistive memory cells 402. The group access device, or WL enable transistor 507 is then turned off via the WL enable line 510 thus completing the reset operation of the resistive memory cells 402. This process, referred to herein as "a sequential reset" continues until all of the resistive memory cells 402 are reset. The embodiment depicted in FIG. 8 requires a reduced Vr when compared to the process depicted in FIG. 7.

In an exemplary embodiment, the predetermined point in time when the access device in the next resistive memory cell 402 in the sequence is turned off is determined during system test based on characteristics of the resistive memory cells 402 and the particular resistive memory cell configuration. In another exemplary embodiment, the predetermined point in time is determined based on sampling the content of the resistive memory element in the previous resistive memory cell 402. In a further exemplary embodiment, a combination of these methods is utilized.

In an exemplary embodiment, the voltage applied to the BL 502 is set to a higher value in an initial phase of the programming in order to facilitate the achieving of possible threshold switching and then reduced to a lower value. This can allow power savings and less strict requirements on the access devices.

Referring back to FIG. 5, the exemplary NAND configuration depicted in FIG. 5 allows for the standard matching capabilities of CAM using two resistive memory cells 402 (each with one memory element access device and one memory element) to store a data bit. In an exemplary embodiment, a "1" is stored as a high resistance value in the first cell and a low resistance value in the second cell; and a "0" is stored as a low resistance value in the first cell and a high resistance value in the second cell. Typical CAM operation includes receiving a data word to be searched made up of data bits (in this example "n/2" data bits when two memory cells 402 store a single data bit) and comparing contents of the memory cells 402 to the data word. For every bit in the data word, two consecutive search line values are generated. For a bit equal to "1", the first search line is high and the second is low. For a bit equal to "0" the first is low and the second is high. In the NAND configuration depicted in FIG. 5, the BL 502 (the ML when used as a CAM) is pulled low when a match occurs and is pulled high when a mismatch occurs.

Exemplary embodiments of the NAND configuration may result in power savings during CAM operation because the ML is pulled low only when a match occurs. This is contrasted to the NOR configuration where the ML is pulled low for every mismatch that occurs. Thus, assuming that more mismatches than matches occur, the NAND configuration will result in less power being required by the ML because the ML will only have to be pre-charged when a match is detected.

In an exemplary embodiment, CAM matching is performed by first pre-charging the BL 502. As described previously, during CAM memory operations, the BL 502 depicted in FIG. 5 is used as a ML, and the WLs 508 depicted in FIG. 5 are used as SLs. To store a word to be searched consisting of "m" bits (x1, . . . , xm), an encoding function is computed that maps the "m" bits into "n>m" bits (y1, . . . , yn). Each resulting bit is then stored in sequence into the group of "n" cells 402 according to the following rule: a "0" is stored as a low resistance value and a 1 is stored as a high resistance value. In exemplary embodiments, the computed resistance values are programmed into the cells by means of the methods above described, in particular with methods such as those illustrated in FIG. 7 and FIG. 8.

In an exemplary embodiment, to operate the search in the CAM, an input bit sequence of logical signals to be searched (x1, . . . , xm) is received by the CAM device (or by a device connected to the CAM device). A data word made up of a bit sequence (y1, . . . , yn; n>=m) is computed by the CAM device as a complementary function of the input bit sequence. The resulting bits are then applied to the search lines in sequence. The "ith" search line maps to a corresponding WL wordline among the WLs 508. The signals applied to the search lines are according the following rule: a bit equal to "1" turns on the corresponding access device and a bit equal to "0" turns off the corresponding access device. Next, the WL enable signal 510 is pulled up. In an exemplary embodiment, the high current flows only if a match is found. The BL discharge is stopped by pulling down the WL enable signal 510. The voltage of the BL 502 is read, and if it has been lowered, then a match was found, meaning that the bits stored in the line match the bits in the data word.

Any CAM mapping functions and operations known in the art may be implemented using the NAND structures described herein. In exemplary embodiments the function used to compute the values to be stored and the complementary function used to compute the search line values coincide and are as follows. Once the input bit vector $(x1, \ldots, xm)$ is received, count the number of zeros in it and represent it with a binary value $(c1, \ldots, ct)$, where $t=(n-m)$. The output bit vector is $(y1, \ldots, yn)=(x1, \ldots, xm, c1, \ldots, ct)$. This encoding function is also known in the literature as Berger code.

The NAND structure described herein may also be utilized for standard memory read operations. To read the one or more bits stored in the "ith" resistive memory cell 402, the "ith" WL 508 is turned on and the rest of the WLs 508 are turned off. Voltage is applied to the BL 502 and the WL enable signal 510 is raised. The current flowing from the BL 502 to ground 506 is measured to determine the value (i.e., the resistance level) stored in the ith resistive memory cell 402.

Figure 9:
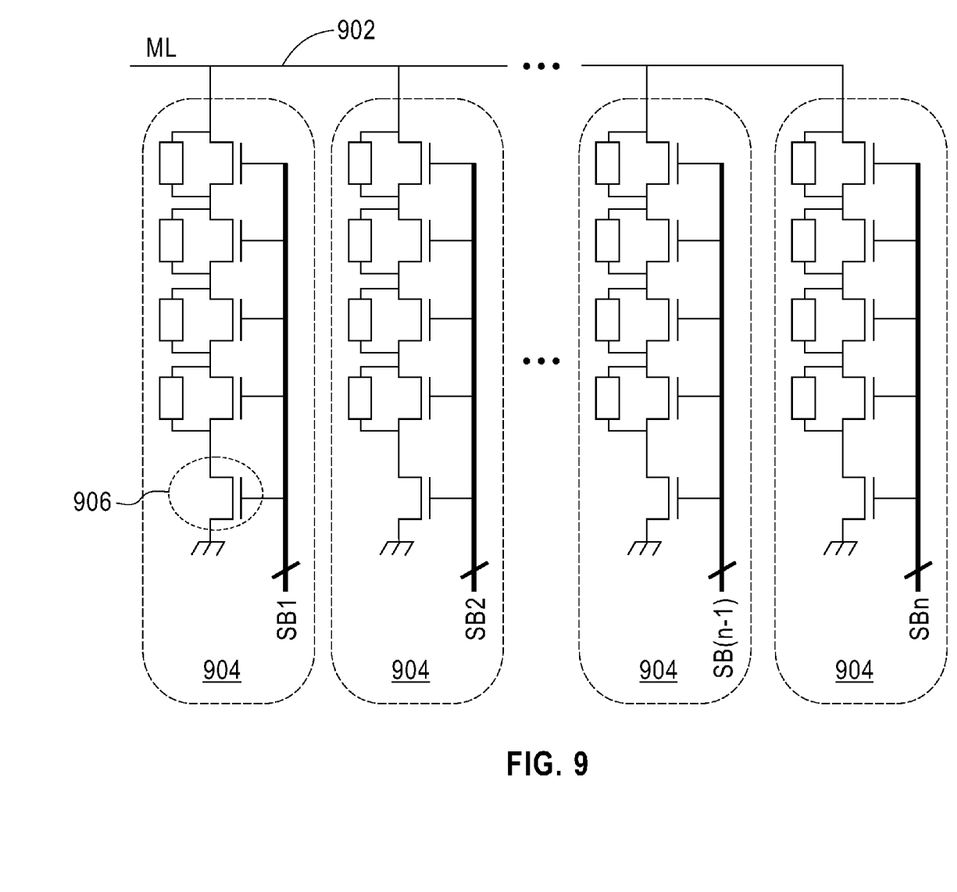
FIG. 9 depicts a PCM structure that may be implemented by an exemplary embodiment.

FIG. 9 depicts a PCM structure that may be implemented by an exemplary embodiment. The structure depicted in FIG. 9 includes "n" groups of memory cells 904 (also referred to herein as "memory cell lines") connected in parallel to a ML 902. In an exemplary embodiment, each group of memory cells 904 is configured as depicted in FIG. 5. The groups of memory cells 904 are comprised of a serial connection of NAND resistive memory cells 402 and the structure is a parallel connection of the groups of memory cells 905. In exemplary embodiments, each group of memory cells 904 comprises four resistive memory cells 402 and a group access device.

The memory structure depicted in FIG. 9 can be operated as a NAND CAM with enhanced matching capabilities. When operating as a NAND CAM a number of strings of bits (also referred to herein as a "data word"), are input to each of the resistive memory cell lines, or group of memory cells 904. In an exemplary embodiment, each string of bits represents the same data word and a search is performed to see if the data word is located in any of the groups of memory cells 904. As described previously, if a match is found, the ML 902 is pulled down and if a match is not found, the ML 902 remains high. As depicted in FIG. 9, each group of memory cells 904 has a line access device 906 (shown in FIG. 5 as the WL enable transistor 504) that controls whether the particular group of memory cells 904 is to be searched. In this manner, based on a particular search pattern, certain groups of memory cells 904 can be searched while other groups of memory cells 904 are not searched. In exemplary embodiments the memory structure depicted in FIG. 9 can be operated as a NOR CAM with enhanced matching capabilities, where a match is declared in the case where the ML 902 is not pulled down.

Figure 10:
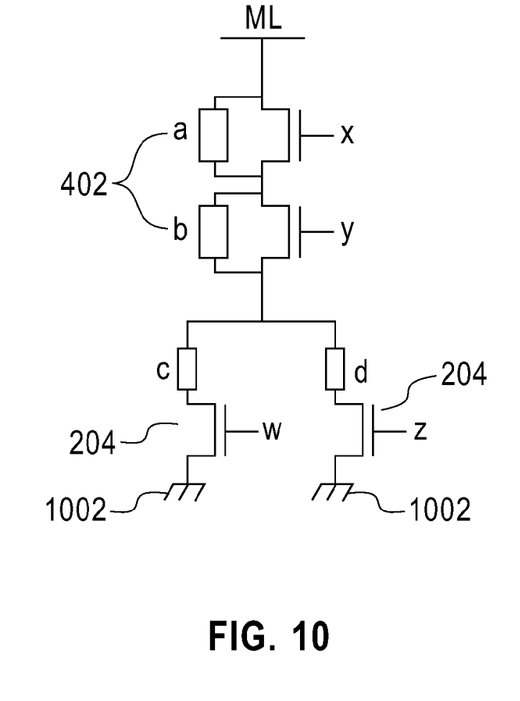
FIG. 10 depicts a memory structure using both NAND basic memory cells and NOR basic memory cells that may be implemented by an exemplary embodiment.

FIG. 10 depicts a memory structure that may be implemented by an exemplary embodiment that utilizes both NAND resistive memory cells 402 and NOR resistive memory cells 204. Various combinations of NAND resistive memory cells 402 and NOR resistive memory cells 204 may be implemented. FIG. 10 is just one such example, having two NAND resistive memory cells 402 connected in a serial manner to each other and to a ML at one end and NOR resistive memory cells 204 at the other end. Each of the NOR resistive memory cells 204 are connected to a ground 1002. In an exemplary embodiment, the structure depicted in FIG. 10 would result in the ML being discharged if the logical expression $(a+x)(b+y)(cw+dz)$ is true, where, in this case, a high resistance represents a logical value "0", a low resistance represents a logical value "1", a high voltage input represents a logical "1" and a low voltage input represents a logical "0".

Figure 11:
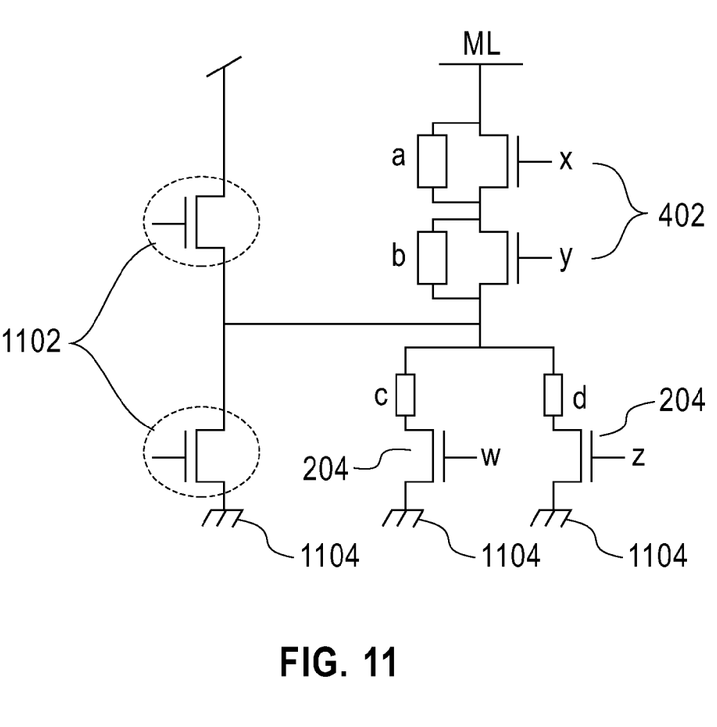
FIG. 11 depicts a memory structure using both NAND basic memory cells and NOR basic memory cells that may be implemented by an exemplary embodiment.

In an exemplary embodiment, such as that depicted in FIG. 11, bypass transistors 1102 connected to the structure depicted in FIG. 10 and to a ground 1104 are utilized to program the NOR resistive memory cells 204 separately from the NAND resistive memory cells 402. In particular, each group of NAND resistive memory cells 402 in series and each group of NOR resistive memory cells 204 in parallel should have at least one extreme connected to a programmable voltage source circuit. The bypass transistors 1102 in FIG. 11 provide a simple instance of such a circuit. The circuit must also provide the capability of programming the voltage source output in high impedance state. The other end of each group can be connected, directly or indirectly through a device, either to a fixed voltage source or to a programmable voltage source. In exemplary embodiments, to program a group of cells, one extreme is connected to ground and the other extreme is connected to the voltage supply. The capability of providing high impedance is used to control the flow of current used to program the resistive memory cells.

In the exemplary embodiment depicted in FIG. 11, to program the NAND resistive memory cells 402, the top transistor of the bypass transistors 1102 is turned off, and w and z are low. This causes the ML to act as the BL 502 and the bottom transistor of the bypass transistors 1102 to act as the group access device, or WL enable transistor 504, as described in FIG. 7 and FIG. 8. To program the NOR resistive memory cells 204, the bottom transistor of the bypass transistors 1102 is turned off, the signals "x" and "y" are high, and the ML is in high impedance. The top transistor of the bypass transistors 1102 is then turned on and the NOR resistive memory cells 204 are then programmed as known in the art by acting on the signals "w" and "z".

Figure 12:
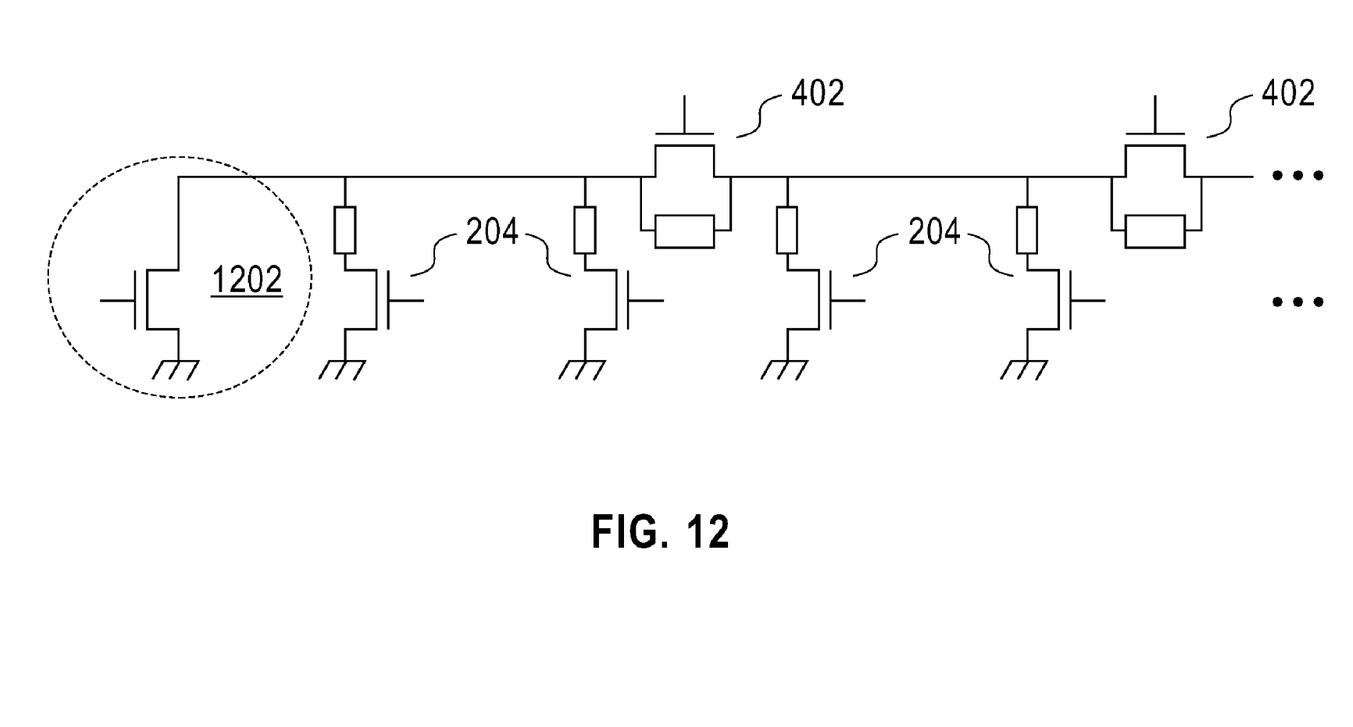
FIG. 12 depicts a memory structure using both NAND basic memory cells and NOR basic memory cells that may be implemented by an exemplary embodiment.

FIG. 12 depicts a memory structure that may be implemented by an exemplary embodiment that utilizes both NAND resistive memory cells 402 and NOR resistive memory cells 204 along with a bypass transistor 1202 to program the NOR resistive elements first and the NAND resistive elements separately. In an exemplary embodiment, all of the NOR resistive elements are programmed first, followed by the NAND resistive elements. This is accomplished by first turning off all access devices of the NOR resistive memory cells 204. The transistor 1202 acts then as the group access device for the NAND resistive memory cells 402 and the right connection of the NAND resistive memory cell 402 which is farthest from the access device acts as bit line. The programming operations described in FIG. 7 and FIG. 8 then apply. The structure depicted in FIG. 12 provides further flexibility in implementing a programmable logical function whose application can be, but is not limited to, enhanced CAMs.

Figure 13:
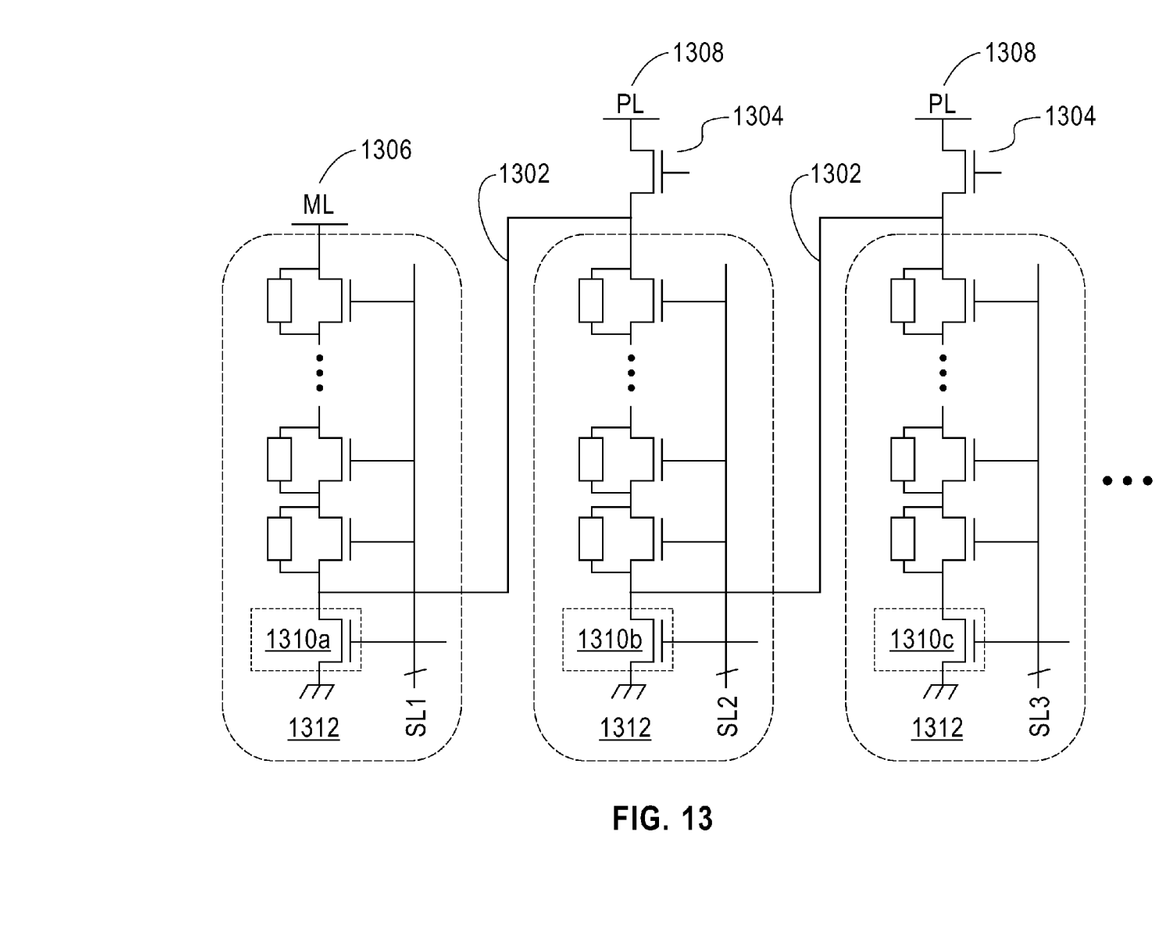
FIG. 13 depicts a memory structure having long match lines that may be implemented by an exemplary embodiment.

FIG. 13 depicts a memory structure that may be implemented by an exemplary embodiment to program long match lines by breaking the match line up into shorter segments 1312 (i.e., memory cell lines). In the embodiment depicted in FIG. 13, programming of the resistive memory cells 402 is performed one segment 1312 at a time using transistors 1304 connected to program lines 1308. In read or search mode, for memory and CAM applications, respectively, the transistors 1304 and all the group access devices 1310 but the last one are turned off (e.g., group access devices 1310a and 1310b are turned off and group access device 1310c is turned on). In order to program a segment 1312, all group access devices 1310 are turned off except for group access device 1310 associated with the segment 1312 to be programmed. The programming of a segment 1312 is then performed in the same way as for a group of memory cells 904. Each of the segments 1312 are connected by a connection line 1302 so that a search can be performed across each of the segments 1312 when the transistors 1304 are turned off. In exemplary embodiments, the connection line 1302 comprises an additional transistor that allows it to reduce programming disturbances. Such transistor is turned on during a search and turned off during the programming phase, allowing for independent and parallel programming of the segments 1312. The described structure combines the capability of using the voltages and currents associated with a short segment 1312 (or group of memory cells 904) and reading a longer memory cell line. This may lead to increased area efficiency.

Figure 14:
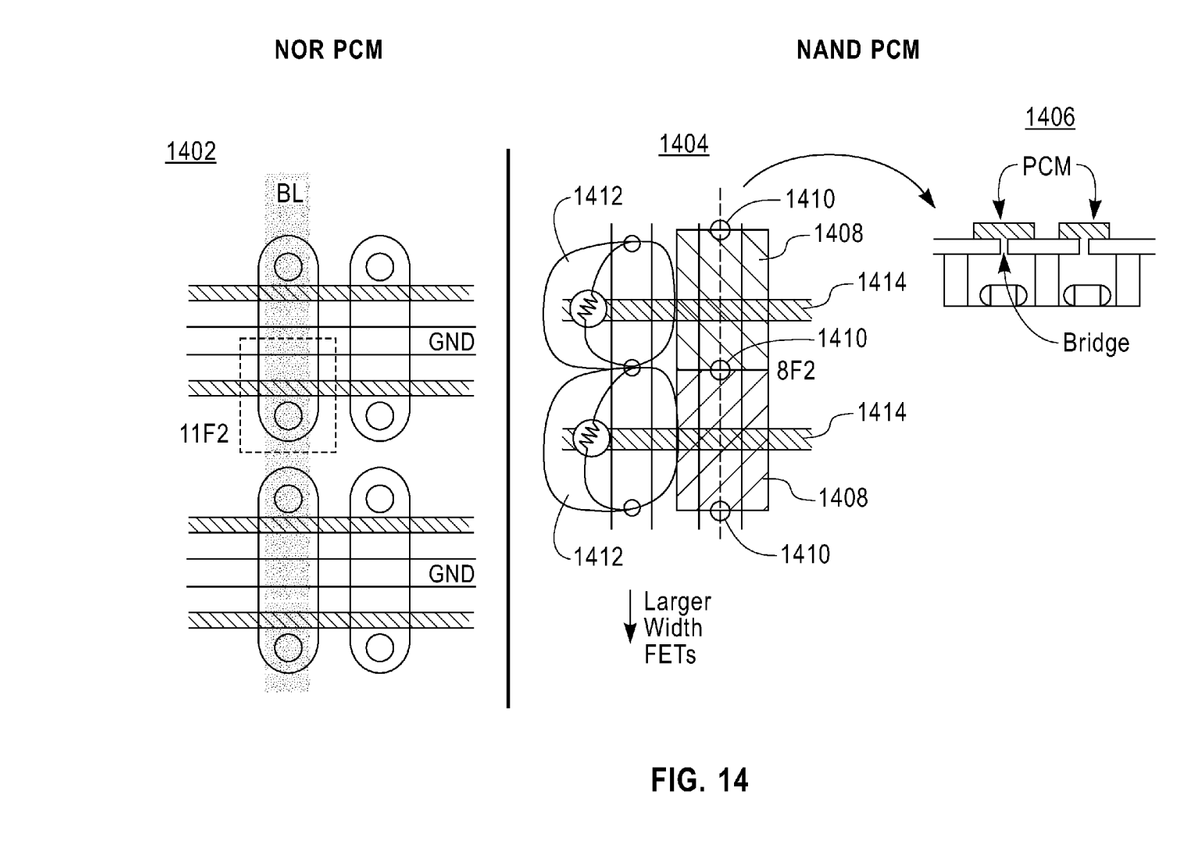
FIG. 14 depicts an integrated circuit layout that may be implemented by an exemplary embodiment.

FIG. 14 depicts an integrated circuit layout 1404 of a NAND resistive memory cell 402 that may be implemented by an exemplary embodiment. FIG. 14 also includes a side view 1406 of the exemplary embodiment and an integrated circuit layout 1402 of a NOR resistive memory cell 204 for comparison purposes.

The circuit layout 1404 of the NAND resistive memory cell 402 depicted in FIG. 14 includes two transistors 1408 and two resistors 1412. As shown in FIG. 14, a contact 1410 is shared between the source and drain of the transistors 1408 that are next to each other in the series of memory elements in a group, or line. FIG. 14 also depicts the gates 1414 on the transistors 1408 and a shared contact between the resistors 1412.

The circuit layout 1402 of the NOR resistive memory cell 204 requires more space than the NAND circuit layout 1404. The NOR resistive memory cells 204 cannot share contacts between the transistors because of the serial connection between the access devices and the memory elements in the NOR resistive memory cell 204. In addition, each NOR resistive memory cell 204 requires a ground, as depicted in the circuit layout 1404 in FIG. 14.

Thus, the use of an exemplary NAND resistive memory cell 402, as depicted in FIG. 14, results in a more compact circuit layout than a NOR resistive memory cell 204. In the embodiments depicted in FIG. 14, two NAND resistive memory cells 402 have a footprint of $8F^2$, where F denotes the feature size for the considered lithographic process, and two NOR resistive memory cells 204 have a footprint of $11F^2$.

As described above, exemplary embodiments of the NAND configuration may result in density savings because only one contact on the silicon is required by the access devices that are next to each other in the line and have electrically connected sources and drains.

Further density savings may be realized because the transistors in the NAND resistive memory cells 402 must sustain only a fraction of the set current that the transistors in the NOR resistive memory cells 204 must sustain. Thus, the transistors in the NAND resistive memory cells 402 may be smaller than those required by the NOR resistive memory cells 204.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A memory comprising:
a first group of resistive memory cells in a memory configured to implement a programmable logical function, wherein an output from the first group of resistive memory cells depends on all of the values stored in the first group of resistive memory cells, the first group of resistive memory cells comprising:
a plurality of first resistive memory cells connected to each other in a series having two extremes, each first resistive memory cell in the group comprising:
a resistive memory element for storing a resistance value; and
a memory element access device for controlling access to the resistive memory element, the memory element access device connected in parallel to the resistive memory element;
a group access device for controlling access to the first resistive memory cells, the group access device connected to one of the extremes; and
a second group of resistive memory cells connected in parallel to the first group of resistive memory cells.

2. The memory of claim 1, wherein the resistive memory elements are phase change memory (PCM) elements.

3. The memory of claim 1, further comprising a second group access device for controlling access to the first resistive memory cells, the second group access device connected to a different extreme than the group access device.

4. The memory of claim 1, wherein the memory element access devices are field effect transistors (FETs) including two diffusions, and the resistive memory elements are PCM elements each including a first side connected to one of the FET diffusions of a FET and a second side connected to the other FET diffusion of the FET.

5. The memory of claim 1, wherein the memory is a content addressable memory (CAM).

6. A method for writing to memory, the method comprising:
- raising a voltage level at a first extreme of a group of resistive memory cells in a memory that are connected to each other in a series having two extremes including the first extreme and a second extreme, each resistive memory cell in the group including a resistive memory element for storing a resistance value and a memory element access device for controlling access to the resistive memory element, the memory element access device connected in parallel to the resistive memory element, the group connected to a group access device at one of the extremes;
- turning off the memory element access devices in the resistive memory cells;
- programming the resistive memory cells in the group to a reset state, the programming including turning on the group access device for the group, turning on the memory element access devices in the resistive memory cells in the group, turning off the memory element access devices in the group, and turning off the group access device for the group; and
- programming selected resistive memory cells in the group to a set state, the programming including turning on the group access device for the group, turning on the memory element access devices in the resistive memory cells in the group, turning off the memory element access devices in the selected resistive memory cells in the group, and turning off the group access device for the group, wherein the programming selected resistive memory cells in the group configures the memory to implement a programmable logical function, and an output from the group of resistive memory cells depends on all of the values stored in the group of resistive memory cells.

7. The method of claim 6, wherein the turning off the memory element access devices in the selected resistive memory cells in the group is performed in sequence.

8. The method of claim 6, wherein the turning off the memory element access devices in the group is performed in sequence.

9. The method of claim 6, wherein the reset state is a high resistance state and the set state is a low resistance state.

10. The method of claim 6, wherein the resistive memory cells are phase change memory (PCM) cells.

11. The method of claim 6, wherein the selected resistive memory cells includes all of the resistive memory cells in the group.

12. The method of claim 6, wherein the memory is a content addressable memory (CAM).

13. A memory comprising:
a group of resistive memory cells in a memory configured to implement a programmable logical function, wherein an output from the group of resistive memory cells depends on all of the values stored in the group of resistive memory cells, the group of resistive memory cells comprising:
- a plurality of resistive memory cells connected to each other in a series having two extremes, each resistive memory cell in the group comprising:
  - a resistive memory element for storing a resistance value; and
  - a memory element access device for controlling access to the resistive memory element, the memory element access device connected in parallel to the resistive memory element;
- a group access device for controlling access to the resistive memory cells, the group access device connected to one of the extremes; and
an additional resistive memory cell connected to the group of resistive memory cells, the additional resistive memory cell comprising:
- an additional resistive memory element for storing a resistance value; and
- an additional memory element access device for controlling access to the additional resistive memory element, the additional memory element access device connected in a series having two extremes to the additional resistive memory element, each extreme connected to one of a power supply, a ground, and circuitry for controlling a voltage of the extreme.

14. The system of claim 13, wherein the memory is a content addressable memory (CAM).

15. A memory comprising:
a group of resistive memory cells comprising:
- a plurality of resistive memory cells connected to each other in a series having two extremes, each resistive memory cell in the group comprising:
  - a resistive memory element for storing a resistance value; and
  - a memory element access device for controlling access to the resistive memory element, the memory element access device connected in parallel to the resistive memory element; and
- a group access device for controlling access to the resistive memory cells, the group access device connected to one of the extremes, wherein the memory is configured to operate as a content addressable memory (CAM) searching for a stored word and wherein for each bit in the stored word two corresponding resistive memory cells in the group are programmed.

16. The memory of claim 15, wherein the CAM is a ternary CAM.

* * * * *